United States Patent [19]
Chou

[11] 3,946,368
[45] Mar. 23, 1976

[54] SYSTEM FOR COMPENSATING VOLTAGE FOR A CCD SENSING CIRCUIT

[75] Inventor: Sunlin Chou, Santa Clara, Calif.
[73] Assignee: Intel Corporation, Santa Clara, Calif.
[22] Filed: Dec. 27, 1974
[21] Appl. No.: 536,797

[52] U.S. Cl............ 340/173 R; 307/221 C; 328/37
[51] Int. Cl.² G11C 11/40; G11C 19/00; H03K 17/60
[58] Field of Search............ 340/173 R; 328/37, 50; 307/224, 221 C, 222

[56] References Cited
UNITED STATES PATENTS

| | | | |
|---|---|---|---|
| 3,643,106 | 2/1972 | Berwin et al.................... | 340/173 R |
| 3,763,480 | 10/1973 | Weimer.......................... | 340/173 R |
| 3,848,236 | 11/1974 | Troutman...................... | 340/173 R |

Primary Examiner—Vincent P. Canney
Attorney, Agent, or Firm—Spensley, Horn & Lubitz

[57] ABSTRACT

A system for providing a compensated voltage used for precharging the detector/refreshing amplifiers in a charge-coupled memory employing a plurality of shift registers. A pair of dummy registers are used to generate a reference register output signal which is applied to a dummy sensor. The output of the dummy sensor is used to control, through a current source, the compensated voltage; the compensated voltage is used to pre-charge the dummy sensor. The system is particularly adaptable for an MOS CCD memory employing two layer polycrystalline silicon technology.

15 Claims, 5 Drawing Figures

SYSTEM FOR COMPENSATING VOLTAGE FOR A CCD SENSING CIRCUIT

BACKGROUND OF THE INVENTION

1. Field of the Invention

The invention relates primarily to the field of charge-coupled devices, particularly charge-coupled devices used in shift registers and memories.

2. Prior Art

Charge-coupled devices (CCD) have been known for a number of years and have found applications, for example, in the fields of memory storage and video displays ("Charge-Coupled Devices - A New Approach to MIS Device Structures", IEEE Spectrum, July 1971, by W. S. Boyle and G. E. Smith, beginning on page 18). In the memory field, particularly where metal-oxide-silicon (MOS) technology is employed, memory storage is feasible where a plurality of shift registers are fabricated on a silicon substrate. An analysis of anticipated cost of such CCD devices, in comparison to TTL RAMs and other semiconductor memories and other memory storage means such as magnetic disks may be found in an article entitled "Charge-Coupled Devices Move in on Memories and Analog Signal Processing", Electronics, Aug. 8, 1974, by Laurence Altman, beginning on page 91.

In order to mass produce a CCD memory one problem that must be solved is the reliable detection of the output from a CCD device both for reading information from the memory and for refreshing it. Typically, the charge output of any particular CCD device will vary from one production lot to another. For example, CCD devices are known to be particularly sensitive to variations in device dimensions which will occur in normal masking operations. Also, at high temperatures and/or at low operating frequencies, thermal generation of carriers can significantly affect the CCD output. Moreover, to achieve low cost, high density smaller devices are required which make signal level detection even more difficult.

In order to fabricate a reliable, low cost CCD memory, some "on-chip" self adjustment or compensation must be provided to compensate for the above-described variations. The present invention provides a self-regulating signal which adjusts the threshold of the detection circuitry so that the latter correctly senses the output of a storage charge-coupled shift register. The disclosed system provides built-in compensation which enables reliable and effective sensing despite variations due to processing or operating frequency, temperature or voltage.

SUMMARY OF THE INVENTION

An apparatus for providing a regulated potential in an MOS-CCD memory which includes a plurality of charge-coupled shift registers for storing information is disclosed. A pulse supply means which includes a charge-coupled shift register for generating a register reference output signal and a sensor having an output and an input coupled to the register output signal for sensing the register output signal are utilized. A regulating means provides a regulated output potential, this means being controlled by the output of the sensor. A feedback means feeds back at least a portion of the regulated output to the sensor. The regulated output potential is used in the sensing of information stored in the memory's shift registers.

DETAILED DESCRIPTION OF THE INVENTION

The present invention discloses a system for providing a regulated or compensated voltage used for precharging a charge-coupled device (CCD) detector or rereshing amplifier. The invention in its presently preferred embodiment is utilized in a 16,384 bit rapid-access CCD serial memory. The memory comprises 64, 256-bit recirculating CCD registers and utilizes a 4-phase input clock signal. The four phases are identified and shown in FIG. 5 as $\phi_1$, $\phi_2$, $\phi_3$ and $\phi_4$. A single system for regulating a potential, as herein disclosed, is utilized to furnish a regulated voltage to each of the refresh amplifiers associated with the recirculating charge-coupled registers.

In the presently preferred embodiment the entire memory including decoders, data input and data output buffers, address buffers and timing generators along with the recirculating charge-coupled shift registers and refresh amplifiers are fabricated on a single silicon substrate. Double layer polycrystalline silicon technology is employed on a p-type silicon substrate with n-channel field effect transistors and n-channel charge-coupled registers. While the "double poly" fabrication techniques are preferred, it will be appreciated that this specific fabrication technique, in addition to other specific aspects of the invention, are disclosed in order to provide a full appreciation of the invention and not to limit the invention.

Figure 2:
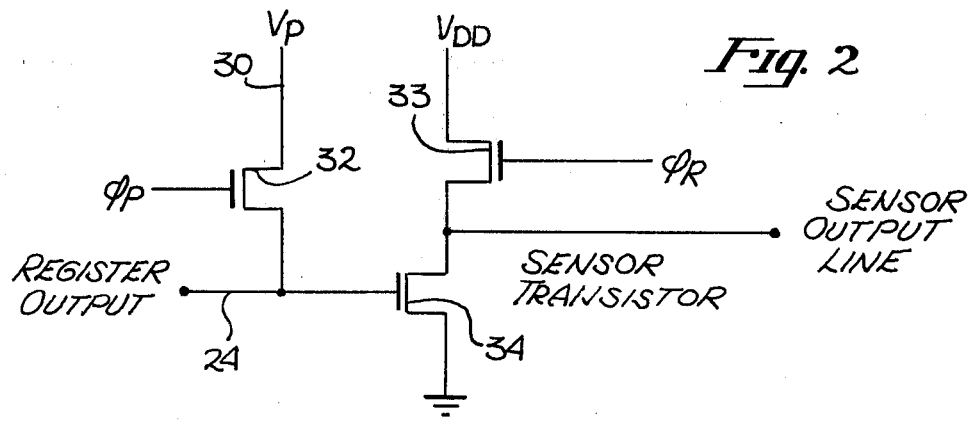
FIG. 2 is a circuit diagram illustrating a single sensing circuit used for sensing the output of a charge-coupled shift register.
Figure 5:
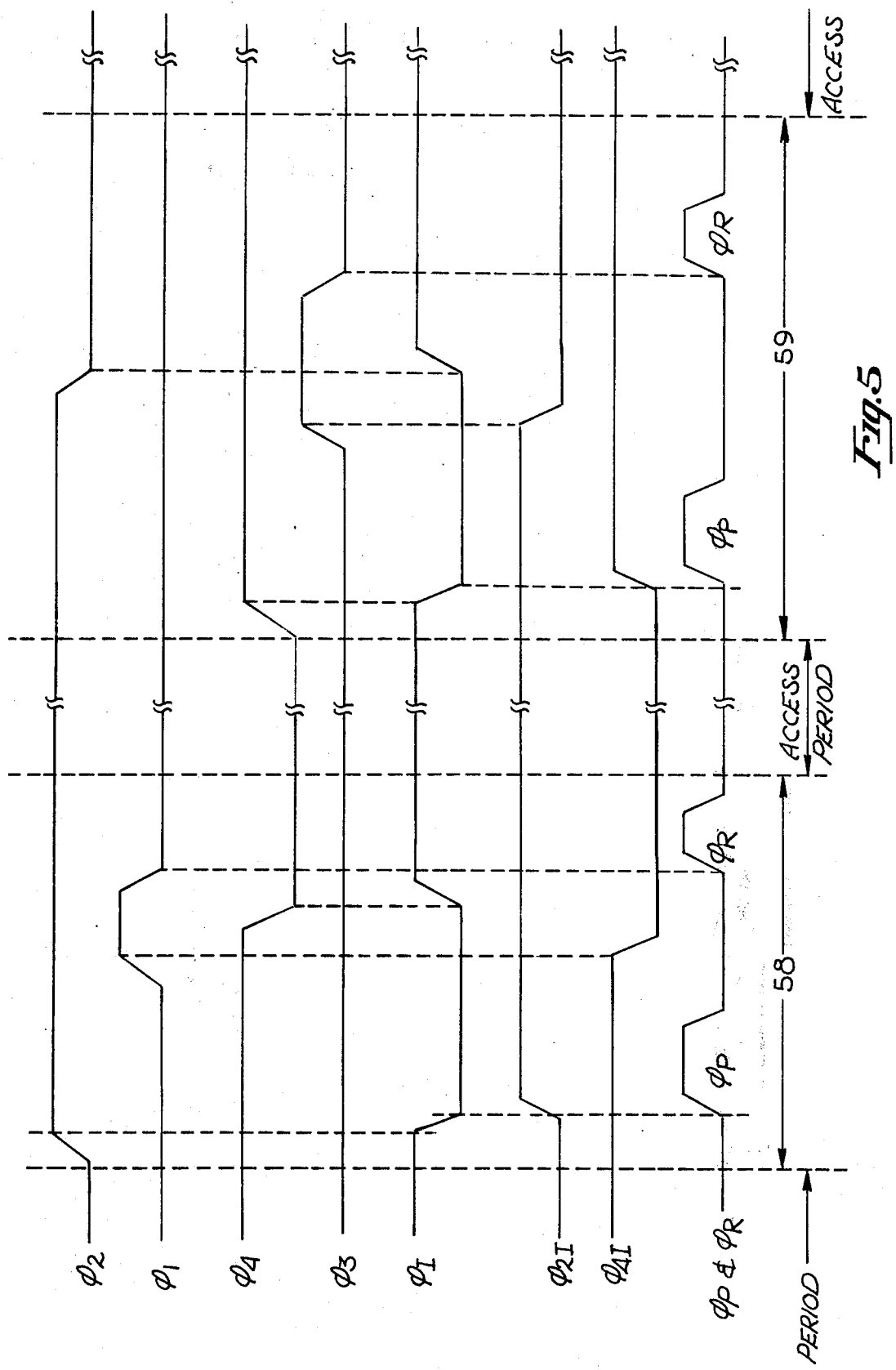
FIG. 5 is a graph illustrating a plurality of timing signals associated with the operation of the presently preferred embodiment of the invention.

Referring first to FIG. 2, a circuit for sensing the output charge from a charge-coupled shift register (hereinafter referred to as a storage register) is illustrated, with node 24 being coupled to the output of the storage register. A sensor transistor 34 is utilized to sense the charge on node 24 and to provide an output signal on the sensor output line. Transistor 34 (as are all the transistors in the presently preferred embodiment) is an n-channel transistor fabricated with a polycrystalline silicon gate. One terminal of transistor 34 is coupled to ground. (Note that for convenience ground is assumed to be at zero potential, ground or ground potential need not be at zero potential, and additionally the ground illustrated in the drawings of this application is not in the presently preferred embodiment maintained at the same potential as the substrate since substrate biasing is employed.) The other terminal of transistor 34 is coupled to a positive potential $V_{DD}$ through transistor 33. The sensing node 24 is coupled through transistor 32 to a potential $V_P$, line 30. The gate of transistor 33 is coupled to the source of the $\phi_R$ signal, while the gate of transistor 32 is coupled to the source of the $\phi_P$ signal. The waveforms for the $\phi_P$ and $\phi_R$ signals are shown in FIG. 5.

Figure 1:
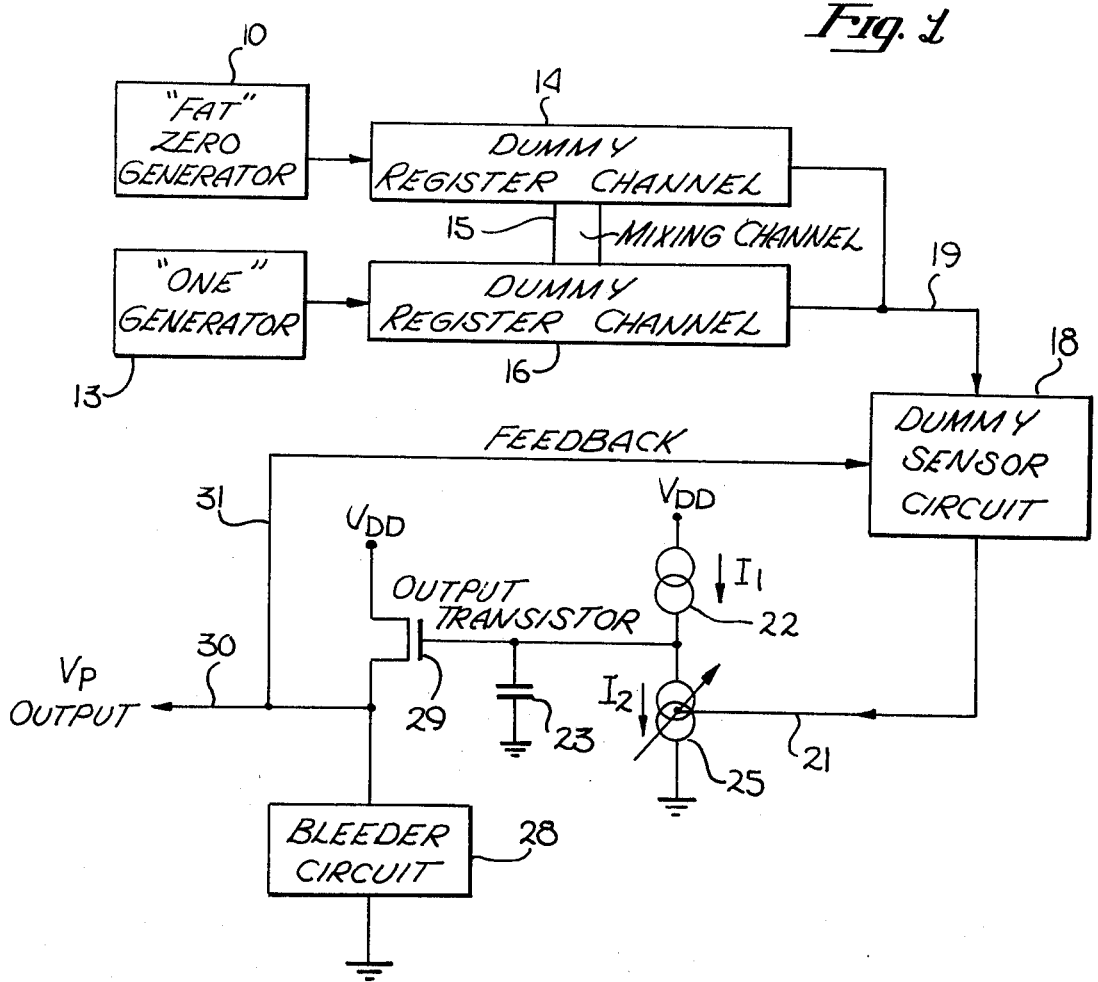
FIG. 1 is a general block diagram of the presently invented system for regulating a potential used by the sensing circuits in a charge-coupled memory.

In the presently preferred embodiment where a dynamic sensor is utilized, the voltage on node 24 after charge is sensed is adjusted by the potential $V_P$, used to precharge this node. The $V_P$ potential, line 30, is the potential which is regulated by the system of the present invention. Referring briefly to FIG. 1, the potential $V_P$ is shown as the output of transistor 29. $V_P$ is a slowly varying potential which draws off charge (electrons) through transistor 32 during the period of time that $\phi_P$ is positive. After $\phi_P$ returns to zero potential as shown in FIG. 5, the output charge from the register is fed into node 24 and changes the potential on the latter. Following this $\phi_R$ becomes momentarily positive and transistor 33 conducts, placing a voltage on the sensor output line.

If we assume that the shift register shifts a large amount of charge representing a binary "1" into the register output well, which is coupled to the sensing node 24, the gate of transistor 34 will be discharged to below the threshold voltage needed for tranistor 34 to conduct and the output line will remain positive after $\phi_R$ has returned to zero from momentarily being positive. On the other hand, if a relatively small amount of charge is placed onto the sensing node 24, that is the charge representing a binary 0, the gate of transistor 34 will remain at a positive potential relative to the threshold of transistor 34 and transistor 34 will conduct discharging the sensor output line. The output line of transistor 34 is sensed after the $\phi_R$ signal returns to zero potential. By way of example, if a 0 is sensed at the sensing node 24, the gate of the sensor transistor 34 will remain at a final potential of approximately 3 to 4 volts. However, if a 1 is shifted by a storage register onto the sensing node 24, the final potential on the gate of transistor 34 will drop to approximately 1 volt, that is below the threshold voltage required for transistor 34 to conduct. The $V_P$ potential thus adjusts the final potential at the sensing node 24 to assure uniform detection. The output from the sensor output line may be utilized either to read information from the memory or to refresh a register such that the information remains circulating within the storage registers as is known in the prior art.

Referring now to FIG. 1, the general block diagram for generating the regulated potential $V_P$ includes a pair of dummy register channels 14 and 16. These channels in the presently preferred embodiment each have the same general geometry (such as length and width) as the storage registers used in the memory. In the presently preferred embodiments p-type channel stops are disposed between each channel of both the dummy registers and the storage registers. Also, in the presently preferred embodiment while the dummy or reference register includes two channels, the storage registers each include four channels. The geometrical dimensions of the sense node regions and the dimensions associated with each of the gates in the sensing circuit are the same as those of the storage registers. Also, since the dummy register is fabricated simultaneously with the fabrication of the remainder of the memory, on the same substrate, the doping levels for the dummy registers are the same as the storage registers. The timing signals used to shift data along the registers are applied uniformly to both register channels 14 and 16 and the storage registers of the memory.

A "fat" zero generator 10 is utilized for generating zeroes which are applied to dummy register channel 14. Note that in the presently preferred embodiment one binary state, the 0 state, is represented by a much smaller amount of charge than the other binary state or the 1 state. A ratio of approximately 1 to 10 is utilized, thus the 0 binary state does include some charge, and is referred to as a fat 0. The technique of utilizing a fat 0 is known in the prior art and is utilized since it has been found that more effective transfer of charge along the register is possible where both binary states include some charge. The 1 generator 13 generates a continual series of ones which are applied to the dummy register channel 16. The zeroes applied to channel 14 and the ones applied to channel 16 are shifted along channels 14 and 16, respectively, in a known manner, as would be stored information in a storage register. In the presently preferred embodiment, as will be discussed, four phase signals, $\phi_1$, $\phi_2$, $\phi_3$ and $\phi_4$ are utilized for shifting information along the storage registers and for shifting the dummy information along the dummy register channels 14 and 16. It will be apprent that the invention is not dependent upon any particular signal phasing and will operate with two phase, three phase or other phasing systems.

A mixing channel 15 is disposed between dummy register channel 14 and dummy register channel 16 such that the charge shifted along these registers is mixed or distributed between the registers. Thus, assuming that the dummy information is being shifted from left to right, each of the portions of channels 14 and 16 to the right of mixing channel 15 will shift charge levels corresponding to a charge approximately midway between a fat 0 and a 1 to the output of the register.

The dummy sensor circuit 18 in the presently preferred embodiment uses a sensor similar in structure to the sensor utilized by the detector/refresh circuits associated with the storage registers. The sensor circuit which is fabricated on the same substrate with the register channels 14 and 16 and for that matter, with all the circuitry illustrated in FIG. 1, receives the output from register channels 14 and 16 on line 19 and the regulated potential on line 31. The dummy sensor circuit 18 acts according to these two signals and produces an output control signal on line 21 which is used to control the current source 25. a specific embodiment for the dummy sensor circuit 18 will be discussed in detail in conjunction with FIG. 3.

The voltage $V_P$ is developed from the potential $V_{DD}$ through an output transistor 29. The source of transistor 29 is coupled to a bleeder circuit 28, the output line 30 and the feedback line 31. The drain of transistor 29 is coupled to the source of potential $V_{DD}$. The gate of transistor 29 is coupled to a capacitor 23 and the common junction formed by current sources 22 and 25.

Current source 22 provides a current $I_1$ in the direction indicated, and has one terminal coupled to $V_{DD}$. Current source 25 provides a variable current ($I_2$) which is varied by the signal on line 21. One terminal of current source 25 is coupled to ground potential. Note that current sources 22 and 25 are only convenient schematic representations of a portion of the regulating circuit, used to facilitate understanding of the principle of operation. In general, current sources 22 and 25 could be represented as any circuit which transforms voltage changes on line 21 into voltage changes on node 29 in a manner such that the entire feedback loop remains stable.

In operation the 0 generator 10 and the 1 generator 13 generate their respective signals which are applied to the dummy register channels 14 and 16 at the same rate as information is supplied to the storage registers of the memory. This information is shifted along channels 14 and 16, and after being distributed at a channel 15 is sensed on line 19. The dummy sensor circuit 18 acts on the feedback signal (line 31) and the outputs from the dummy channels 14 and/or 16 (line 19) and provides an appropriate signal for controlling the current source 25 on line 21. The current source 22 provides a current to the capacitor 23 and tends to increase (i.e., make more positive) the voltage on the gate of transistor 29. On the other hand, the current source 25 tends to lower (i.e., make less positive) the voltage on the gate of transistor 29. The difference in the rate at which current sources 22 and 25 add or remove electrons from the gate of the ouput transistor 29 determines the output potential $V_P$ sensed at the source of the source follower output transistor 29. The capacitor 23 assures that abrupt changes in the output signal $V_P$ will not occur.

Figure 3:
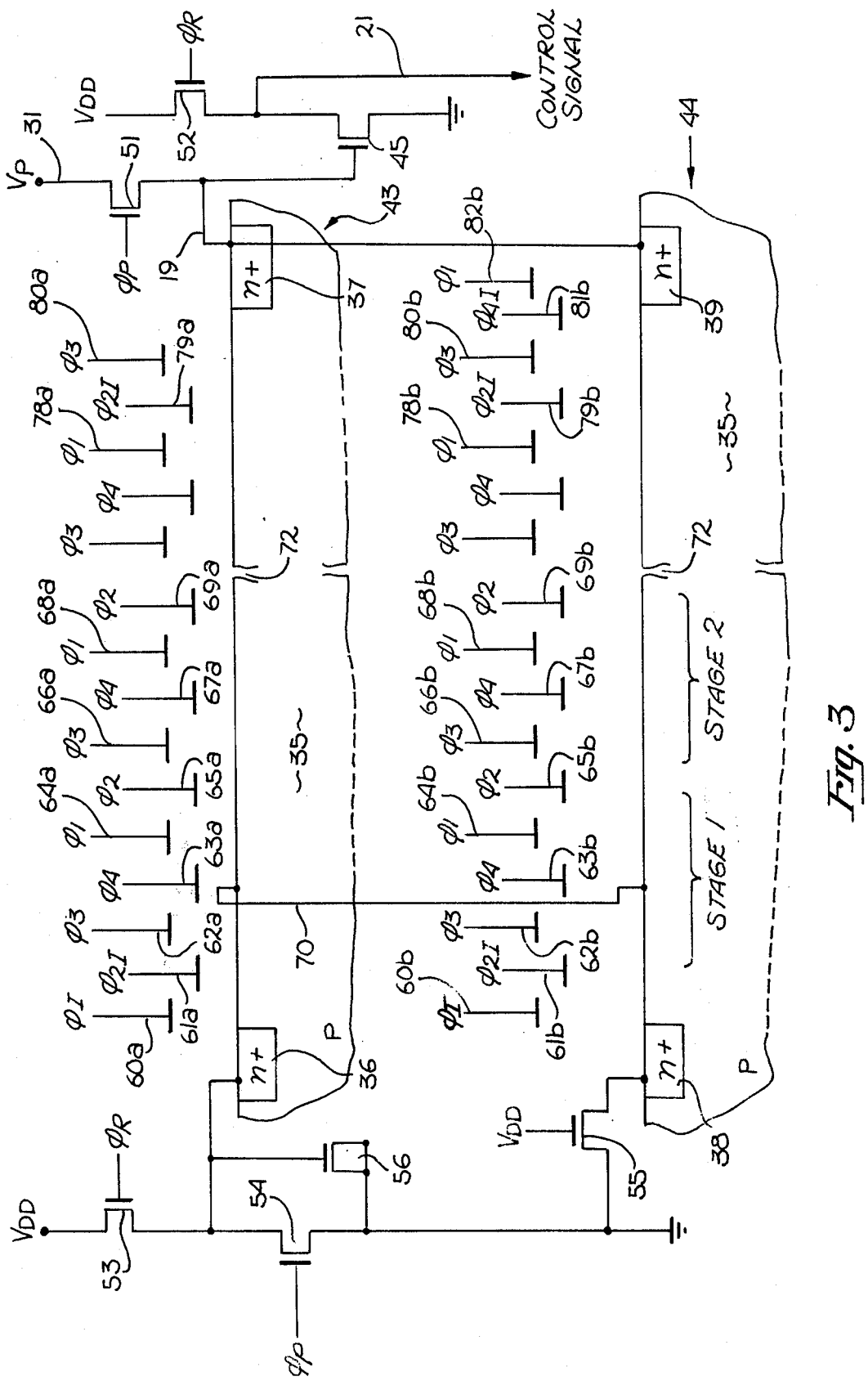
FIG. 3 is a detail circuit diagram illustrating an embodiment of the "zero" generator, "one" generator, dummy register and dummy sensor circuit of FIG. 1.

Referring to FIGS. 1 and 3, in FIG. 3 the presently preferred embodiment of the generators 10 and 13, the dummy register channels 14 and 16 and mixing channel 15 and dummy sensing circuit 18 of FIG. 1 are illustrated in detail. In FIG. 3 the output control signal for controlling a constant current source is again shown (line 21) as is the feedback signal (line 31) which is coupled to the drain of transistors 51.

As mentioned, the dummy registers are disposed on a common substrate with the remainder of the memory, in the presently preferred embodiment the substrate is a p-type substrate 35. One of the dummy register channels 43 is defined by the n+ regions 35 and 37, while the other dummy register channel 44 is terminated by the n+ regions 38 and 39. Only a portion of each of the dummy register channels is illustrated, as indicated by the break 72. Region 36 of channel 43 is coupled to the potential $V_{DD}$ through transistor 53, to one terminal of transistor 54 and to one terminal of capacitor 56. The other terminal of transistor 54, the other terminal of capacitor 56, along with one terminal of transistor 55 are coupled to ground. The capacitor 56 may not be required in some embodiments because of the capacitance associated with the diffused region 36, the common junction of transistors 53 and 54, and the interconnections. The other terminal of transistor 55 is coupled to region 38 of dummy shift register 44. Transistor 55 has its gate coupled to $V_{DD}$, and hence is constantly in a state of conduction. Transistor 54 has its gate coupled to the source of the $\phi_P$ signal, while transistor 53 has its gate coupled to the gate of the $\phi_R$ signal.

The plurality of gates illustrated disposed above the channels of registers 43 and 44 receive the various timing signals used for transferring and storing charge along the registers. These gates in the presently preferred embodiment all comprise polycrystalline silicon and are substantially either on a first level or a second level above the substrate. For convenience, with the exception of $\phi_I$, which is applied to a gate on the second level, all those gates on the first level are numbered with even numbers, while the gates on the second level are numbered with odd numbers. As will be appreciated, the odd numbered gates, that is the gates on the second level, are generally at a greater distance from the substrate 35 than the gates on the first level. In the presently preferred embodiment, substantially the same potential in magnitude is selectively applied to both the first level gates and the second level gates, but the resulting potential well in the substrate is greater for the gates on the first level since they are separated from the substrate by a thinner oxide layer than the gate on the second level. Those gates associated with channel 43 have been labeled with an $a$ while the gates associated with register 44 have been labeled with a $b$. Thus, gate 60a is disposed above the channel 43 while gate 60b is disposed above the channel 44. Both these gates receive the timing signal $\phi_I$. In a similar manner, gates 61a and 61b receive a timing signal $\phi_{2I}$. Gates 62a and 62b through gates 69a and 69b receive the timing signal $\phi_1$ through $\phi_4$, and are used for shifting charge along the register in a known manner. In the presently preferred embodiment the channels 44 and 43 (along with the memory storage registers) each include approximately 64 stages such as indicated by stages 1 and 2 of channel 44.

On the output end of channel 43 charge is transferred by the gates 78a, 79a and 80a into the region 37, while in channel 44 charge is likewise transferred by gates 78b, 79b and 80b, and additionally by gates 81b and 82b into region 39. Both regions 37 and 39 are coupled to line 19, the sensing node for the dummy sensor transistor 45. Note that region 37 appears to be a somewhat larger region in the drawings, and is in fact larger than region 39 in the presently preferred embodiment. The reason for this difference is due to the lay-out used in the presently preferred embodiment as is disclosed in copending application Ser. No. 530,161, filed Dec. 6, 1974, assigned to the assignee of the present application.

Channels 43 and 44 are interconnected by a channel 70 which corresponds to the mixing channel 15 illustrated in FIG. 1. Channel 70 is generally perpendicular to the two parallel channels 43 and 44, and interconnects the channels of registers 43 and 44. It is apparent that this mixing channel serves the function of distributing between these two register channels the charge that is shifted along these channels.

Line 19, which defines a sensing node for channels 43 and 44 of the dummy register, is coupled to the gate of transistor 45 and the source of transistor 51. The other terminal of transistor 51 is coupled to the feedback line 31 (the $V_P$ potential), while the gate of transistor 51 is coupled to the source of the $\phi_P$ signal. The source of transistor 44 is coupled to $V_{DD}$ through transistor 52, the gate of transistor 52 is coupled to the source of the $\phi_R$ signal. The control line 21 is coupled to the drain of transistor 45. Transistor 45, the dummy sensor transistor, in the presently preferred embodiment is of the same general geometry as is the sensor transistors used to sense the output of the storage registers, such as transistor 34 of FIG. 2.

Figure 4:
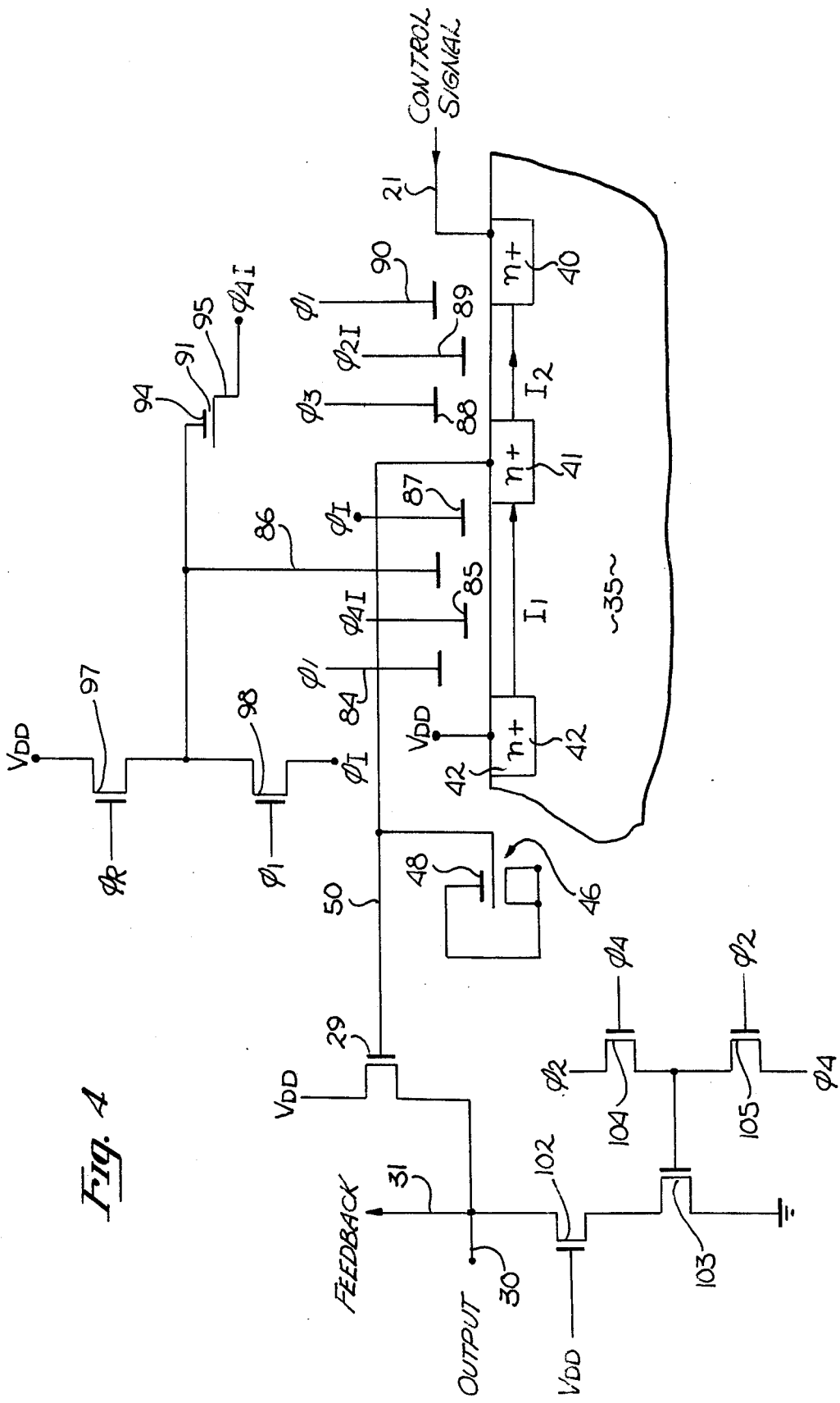
FIG. 4 is a detail circuit diagram which includes an embodiment of the constant current sources and bleeder circuit of FIG. 1.

Referring to FIG. 4, the presently preferred embodiment of the constant current sources 22 and 25, capacitor 23, and bleeder circuit 28 of FIG. 1 are illustrated in detail. Each current source of FIG. 1 comprises in effect a short shift register as shown in FIG. 3. The current source 25 of FIG. 1 includes the n+ regions 40 and 41 disposed in the substrate 35, the control signal on line 21 is coupled to region 40. Region 41 is coupled to line 50 which is common with the capacitor 46 and the gate of the output transistor 29. Gates 88, 89 and 90 are disposed above the channel defined by regions 40 and 41 and are coupled to the source of the timing signals $\phi_3$, $\phi_{2I}$ and $\phi_I$, respectively.

The other current source includes a channel defined by regions 41 and 42. The n+ region 42 is coupled to the source of potential $V_{DD}$. Gates 84, 85, 86 and 87 are disposed above the channel defined by regions 41 and 42. Gates 84 and 85 receive the timing signals $\phi_1$ and $\phi_{4I}$, respectively, while gate 87 is coupled to the source of the timing signal $\phi_I$. The gate 86 is coupled to one electrode 94 of capacitor 91 while the other electrode 95 of the capacitor 91 is coupled to the source of the timing signal $\phi_{4I}$. Gate 86 is also coupled to the common junction between transistors 97 and 98; these series transistors are coupled between the source of the potential $V_{DD}$, and the source of the $\phi_I$ signal. The gate of transistor 97 is coupled to the $\phi_R$ signal, while the gate of transistor 98 is coupled to the source of the $\phi_1$ signal. The transistors 97, 98, along with the capacitor 91, are used for boosting the potential on gate 86. In the presently preferred embodiment the electrode 94 of capacitor 91 comprises a polycrystalline silicon layer which is fabricated along with the upper or second level gates while the electrode 95 is likewise a polycrystalline silicon layer fabricated with the lower level gates.

A "two sided" capacitor 46 is coupled to the line 50. One electrode of the capacitor comprises both an upper or second level polycrystalline silicon layer 48 and a region in the substrate. The other electrode of the capacitor 46 comprises a first level layer of polycrystalline silicon, that is, one on the same level as the even numbered gates.

The drain of the output transistor 29 is coupled to $V_{DD}$ while the source of this transistor is coupled to common node with the feedback line 31, the output line 30 and the drain of transistor 102. The signal appearing at this node is the regulated potential used by all the sensor transistors of the memory. The other terminal of transistor 102 is coupled to ground through transistor 103. The gate of transistor 103 is coupled to the common junction defined by transistors 104 and 105. The series combination of transistors 104 and 105 is coupled between the source of the timing signals $\phi_2$ and $\phi_4$; the gate of transistor 104 is coupled to the source of the timing signal $\phi_4$, and the gate of transistor 105 is coupled to the source of the timing signal $\phi_2$.

Referring briefly to FIG. 5, the various timing signals utilized by the memory in its presently preferred embodiment are illustrated. The timing signals $\phi_1$, $\phi_2$, $\phi_3$ and $\phi_4$ previously mentioned are utilized primarily for shifting data along the storage registers and also for shifting the dummy information along the dummy registers. These signals in the presently preferred embodiment are externally generated and applied to the memory. The signals $\phi_I$, $\phi_{2I}$ and $\phi_{4I}$ along with the $\phi_P$ and $\phi_R$ signals, are generated on the substrate which includes the memory. Note that each of these timing signals includes a broken line which is disposed within a time segment indicated as "access period". This period, in actuality, is much greater in duration than indicated in FIG. 5. During this access period information is read from the memory or placed into the memory. Typically, where a plurality of storage registers are utilized for storing information (for example 64 registers) one or more of these registers may be accessed during this period of time. Other timing signals, such as a chip enable signal, are also used by the memory but are not shown in order not to overcomplicate the present disclosure. The signals $\phi_I$, $\phi_{2I}$, $\phi_{4I}$, $\phi_P$ and $\phi_R$, may be generated utilizing commonly known circuitry.

Referring first to FIG. 3, the operation of the system shown in FIGS. 3 and 4 will be examined. Transistors 53, 54, 55, capacitor 56 along with gates 60a, 60b, 61a and 61b are utilized to generate the dummy information, that is a plurality of ones for dummy register channel 44, and the "fat" zeroes for register channel 43. First referring to region 38 of register 44, it is apparent that this region is continually coupled to ground through transistor 55 since the gate of this transistor is coupled to the source of potential $V_{DD}$. Referring to FIG. 5 and to section 58 of the timing diagrams, it may be seen that $\phi_{2I}$ is positive when the $\phi_I$ signal becomes positive. When this occurs both gates 60b and 61b are positive forming a well in the substrate 35 beneath these gates, thereby causing electrons to be moved from region 38 to the well. Referring to section 59 of the timing diagrams of FIG. 5, the $\phi_I$ signal returns to its zero potential while the $\phi_{2I}$ potential remains positive. When this occurs the charge below gate 61b remains beneath that gate, but the path for charge that existed below gate 60b between region 38 and the well defined by gate 61b is removed. During the period of time that $\phi_{2I}$ remains positive, $\phi_3$ becomes positive at a time when also $\phi_4$ is positive. This allows the charge to be moved to wells defined beneath gate 62b and 63b. From this stage of the register on the charge is transferred along the register to the output in a known manner for a four phase system. Thus, once each timing cycle a 1 is written into the dummy register channel 44.

Referring now to the dummy register channel 43 and to the beginning of the timing signals of FIG. 5, shown in section 58, note that when $\phi_P$ becomes positive the $\phi_I$ signal is in its low or zero state. At this time transistor 54 will conduct and both electrodes of capacitor 56 and region 36 will be coupled to ground potential. Since no positive potential exists on gate 60a, no negative charge is drawn into the channel of register 43 from region 36. After $\phi_P$ returns to zero potential, $\phi_I$ becomes positive at a time when $\phi_{2I}$ is positive. When this occurs deep wells are formed beneath gates 60a and 61a causing charge (negative) to be pulled from capacitor 56 and region 36 into the channel of register 43. During the time when both $\phi_I$ and $\phi_{2I}$ are positive, $\phi_R$ becomes positive causing transistor 53 to conduct. When this occurs some of the electrons stored beneath gates 60a and 61a are drawn-off through transistor 53 leaving a substantially smaller amount of charge (a fat 0) beneath gates 60a and 61a. After $\phi_R$ returns to zero potential $\phi_I$ becomes zero, isolating this remaining charge beneath gate 61a. Following this, $\phi_3$ becomes positive allowing the charge stored beneath gate 61a to be moved beneath gates 62a and 63a. From this point forward the charge is transferred in an ordinary manner for a four phase system.

When the charge in registers 43 and 44 reaches channel 70, it is distributed between the registers and then shifted along the separate channels to the output regions 37 and 39. Note that the $\phi_{2I}$ signal along with the $\phi_{4I}$ signal are used at the output of register channels 43 and 44. The use of these signals is not necessary for the transfer of the dummy information into the output regions of the registers, but rather is done to gain a layout advantage and to permit multiplexing used in the preesently preferred embodiment as disclosed in the above mentioned copening application.

The operation of transistors 51, 52 and 54 is similar to the operation of the circuit discussed in conjunction with FIG. 2. For example, when $\phi_P$ becomes positive, the gate of transistor 45 along with the register output line 19 beomes positively charged to the regulated potential $V_P$. When the dummy signals or charge transferred by channels 43 and 44 reach the output regions 37 and 39, the voltage is reduced. If sufficient positive charge has been removed from line 19, transistor 45 will not conduct and the charge placed on line 21 during the time that $\phi_I$ is positive will remain on line 21. On the other hand, if sufficient charge remains on line 19 and transistor 45 conducts the control line 21 will be at a lower potential. As will be discussed, the potential $V_P$ is adjusted as a function of the ouput of channels 43 and 44 such that the final potential remaining on the gate of transistor 45 is close to the threshold of transistor 45. It will be apparent that for those sensor transistors which are part of the storage registers, such as transistor 34 of FIG. 2, this adjustment to $V_P$ will assure that transistor 34 will conduct when a 0 is sensed on node 24, and likewise transistor 34 will not conduct when a 1 is sensed at node 24. Variations (such as due to processing) in parameters which affect the storage registers will affect the dummy registers in a like manner, and cause $V_P$ to change in the direction necessary to compensate for the variation as will be explained.

Referring now to FIG. 4, one current source is continually providing the current $I_1$ to the line 50, while the controlled current source is continually removing current ($I_2$) from line 50. Electrons are moved from region 41 beneath gates 87, 86, 85 and 84 to region 42. Region 42, since it is continually coupled to $V_{DD}$ acts as a sink for charge moved to it. Electrons are also moved from region 40 to region 41 beneath gates 90, 89 and 88. The amount of this charge is determined by the control signal of line 21. (The circuit comprising transistors 97 and 98 and capacitor 91 is utilized to boost the potential on gate 86 to a level greater than $V_{DD}$ during the period of time that $\phi_{4I}$ becomes positive.)

Assume for the sake of discussion that for some reason the charge shifted along the dummy register channels 43 and 44 has diminished. In such a situation it would be expected that the charge shifted along the storage registers would likewise be diminished. Since we have assumed that the charge has diminished, the final voltage on the sensing nodes will become larger (since fewer electrons are shifted onto the node). This in turn will cause transistor 45 to conduct more heavily. In turn, line 21 becomes more negative or closer to ground potential. As line 21 becomes closer to ground potential, more electrons are moved from region 40 to region 41, thereby lowering line 50 in potential. The lowering of line 50 in potential will cause the output voltage $V_P$ on lines 30 and 31 to decrease. Since the charge moved along the registers has been diminished, it is of course desirable to have $V_P$ lower in potential to compensate for the diminished charge. In a similar fashion, had the charge moving along the dummy register channels 43 and 44 increased (for example, because of increased generation of thermal carriers in the substrate), $V_P$ would likewise increase, thereby compensating for the increased charge.

Capacitor 46 serves the function of smoothing the signal applied to the gate of the output transistor 29, thereby assuring that the $V_P$ changes are not abrupt.

The transistor 103 is used to bleed line 30 to obtain a lower output impedance and to assure that transistor 29 will not be inadvertently turned off by a stray signal that tends to increase the potential on line 30. Transistors 104 and 105 act as an AND gate for the $\phi_2$ and $\phi_4$ signals, while transistor 102 is used to limit the current flow from line 30 to ground. The reason for switching the bleeder current rather than keeping it constant is to conserve standby power consumption.

Thus, in the presently preferred embodiment where the zeroes and ones stored by the storage registers are generated in the same fashion as the zeroes and ones used by the dummy registers, and where the geometry of the dummy registers is substantially similar to the geometry of the storage registers (except that the storage registers include two additional channels in the presently preferred embodiment) a dummy register output for controlling the sensing devices is derived which compensates for variations which affect the output of the storage registers. It will be apparent that other embodiments may be used, for example, a dummy register could be fed with charge representing binary ones spaced at appropriate intervals. The feedback loop would then be enabled only when a one output is expected from the dummy register. For this implementation the $V_P$ would be adjusted to a "worsecase 1" charge level. Another variation, although not presently preferred, would be to apply the control signal on line 21 directly to the output transistor 29. In this alternate embodiment the CCD current sources would be eliminated.

I claim:
1. An apparatus for providing a regulated potential in an MOS-CCD memory which includes a plurality of charge-coupled memory shift registers for storing information comprising:
   a pulse supply means including a charge-coupled shift register for generating a register reference output signal;
   a sensor having an output and an input coupled to said register output signal for sensing said register reference output signal;
   a regulating means for providing a regulated output potential, said regulating means being controlled by said output of said sensor; and
   feedback means, for feeding back at least a portion of said regulated output potential to said sensor;
   whereby said regulatd output potential may be used in the sensing of information stored in said memory shift registers.
2. The apparatus defined by claim 1 wherein said output of said sensor is a function of the relative magnitudes of said register reference output signal and said regulated output potential.
3. In a CCD memory system disposed on a substrate employing at least one sensing transistor for sensing the output of a storage shift register, an improvement for generating a reference potential for said sensing transistor comprising:
   a shift register having the same general geometry as said storage shift register, disposed on said substrate; and
   voltage generation means for generating said reference potential, said generation means being controlled, at least in part, by said shift register;
   whereby said improvement compensates for parameter variations on said substrate.
4. The improvement defined by claim 3 wherein a predetermined signal is applied to said shift register by a signal generator disposed on said substrate.

5. In a circuit for sensing the output charge from a charge-coupled storage shift register which includes a sensing node for receiving said output charge, an improvement for adjusting said output charge on said sensing node as a function of non-programmed variations in the magnitude of said charge where said circuit and said shift register are disposed on a common substrate comprising:
   a reference shift register disposed on said common substrate;
   signal generation means for generating an input signal for said reference shift register coupled to said reference shift register;
   voltage generation means for generating an adjustment signal; and
   comparator means for comparing the output of said reference shift register with said adjustment signal and for controlling said voltage generation means, coupled to said reference shift register and said voltage generation means;
   whereby said adjustment signal may be used to adjust said output charge on said sensing node thereby providing improved sensing of charge from said storage shift register.

6. The improvement defined by claim 5 wherein said reference shift register has the same general geometry as said storage shift register.

7. The improvement defined by claim 6 wherein said reference shift register includes two spaced apart, parallel channels and said storage shift register includes four spaced apart, parallel channels.

8. The improvement defined by claim 7 wherein said signal generation means generates a series of signals representing a first binary state for one of said reference registers and a series of signals representing a second binary state for the other of said reference registers.

9. The improvement defined by claim 8 including an interconnecting channel disposed between said two channels of said reference shift register.

10. In a charge-coupled memory employing a plurality of storage shift registers and a plurality of sensing transistors for sensing the output of said storage shift registers, a system for generating a reference potential which is coupled to said sensing transistors comprising:
   at least one generation means for generating a signal representative of a binary state;
   at least one reference register coupled to said generation means, said reference register having at least one channel of approximately the same length and width as a channel of said storage shift register;
   a reference sensing transistor having the same general characteristics as said sensing transistors, said reference sensing transistor having its gate coupled to the output of said reference register and also having its gate selectively coupled to said reference potential, said reference sensing transistor having an output control signal line;
   an output transistor for controlling said reference potential, said output transistor having a gate;
   a first current source coupled to said gate of said output transistor;
   a variable current source coupled to said gate of said output transistor, said variable current source being coupled to said output control signal line of said reference sensing transistor;
   whereby said reference potential will vary as a function of the output of said reference register and as a function of variations in said reference sensing transistor.

11. In a charge-coupled memory employing a plurality of storage shift registers and a plurality of sensing transistors, a system for generating a reference potential coupled to said sensing transistors comprising;
   a register having a first and a second channel, each of said channels being of approximately the same length and width as a channel of said storage registers;
   a first generation means for generating a charge representing a first binary state, coupled to said first channel;
   a second generation means for generating a charge representing a second binary state coupled to said second channel;
   a cross channel interconnecting said first and second channels;
   a transistor for providing a control signal having its gate coupled to the output of said register, said gate being selectively coupled to said reference potential;
   an output transistor for controlling said reference potential, said output transistor including a gate;
   a first current source including a channel coupled to said gate of said output transistor; and
   a second current source including a channel coupled to said gate of said output transistor, said second current source being controlled by said control signal of said transistor;
   whereby the output of said output transistor may be used by said sensing transistor in sensing of charge from said storage shift registers.

12. The system defined by claim 11 wherein a capacitor is coupled to the gate of said output transistor.

13. The system defined by claim 12 wherein a bleeder circuit is coupled to the output of said output transistor.

14. The system defined in claim 13 wherein said memory and said system are disposed on a common substrate.

15. The system defined in claim 14 wherein the channels of said storage shift registers, said channels of said register and said channels of said current sources are n-channels.

* * * * *